United States Patent [19]
Watarai

[11] Patent Number: 6,037,802
[45] Date of Patent: *Mar. 14, 2000

[54] TRISTATE BUFFER HAVING A BIPOLAR TRANSISTOR

[75] Inventor: Seiichi Watarai, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/864,853

[22] Filed: May 29, 1997

[30] Foreign Application Priority Data

May 30, 1996 [JP] Japan ................................ 8-137165

[51] Int. Cl.⁷ ............................................. H03K 19/0175
[52] U.S. Cl. ............................. 326/84; 326/57; 326/110
[58] Field of Search .................................. 326/57, 58, 64, 326/80, 81, 84, 109, 110

[56] References Cited

U.S. PATENT DOCUMENTS

| | | | |
|---|---|---|---|
| 4,531,068 | 7/1985 | Kraft et al. | 326/57 |
| 4,703,203 | 10/1987 | Gallup et al. | 326/58 |
| 5,300,829 | 4/1994 | Lev et al. | 326/57 |
| 5,371,423 | 12/1994 | Berthold et al. | 326/57 |
| 5,446,321 | 8/1995 | Yoshino et al. | 326/57 |

FOREIGN PATENT DOCUMENTS

| | | |
|---|---|---|
| 2-214219 | 8/1990 | Japan . |
| 4-43713 | 2/1992 | Japan . |

*Primary Examiner*—Michael Tokar
*Assistant Examiner*—Don Phu Le

[57] ABSTRACT

A tristate buffer comprises an output block having a pair of NPN bipolar transistor and nMOS transistor between the source line and ground line and connected to each other at the output terminal of the tristate buffer. The tristate buffer has a base potential control block for discharging the base of the NPN transistor and to couple the base to the output terminal of the tristate buffer during an initial stage of the high-impedance state. After the initial stage of the high-impedance state, the base and output terminal are disconnected from each other. A reverse bias overvoltage occurring in the base-to-emitter P-N junction and a current flow during the high-impedance state are eliminated.

4 Claims, 4 Drawing Sheets

6,037,802

TRISTATE BUFFER HAVING A BIPOLAR TRANSISTOR

BACKGROUND OF THE INVENTION (a) Field of the Invention

The present invention relates to a tristate buffer having a bipolar transistor such as used in a BiCMOS semiconductor integrated circuit and, more particularly, to a tristate buffer used for a bus line connecting between different integrated circuits or between different circuit portions in a single integrated circuit.

(b) Description of the Related Art

Tristate buffer is generally used for a bus line connecting different integrated circuits or different circuit portions in a single integrated circuit. The tristate buffer functions for time sharing of bus line for data transmission without overlapping different signals. The tristate buffer assumes three logic states for signal transmission including high-level, low-level and high-impedance states.

When a high-level signal is to be held on the bus line, a tristate buffer which is in a state of outputting a low-level signal is maintained at a high-impedance state to avoid a signal overlap. The tristate buffer has input and output terminals for signal transmission and a control input terminal for effecting the high-impedance state or low-impedance state for outputting the high-or low-level signals. In current integrated circuits, CMOS transistors are widely used for a low power consumption and a high integration density instead of bipolar transistors, which have a high operational speed but have a lower integration density and consumes larger power. To take advantage of the high operational speed of the bipolar transistors, BiCMOS IC is also widely used wherein bipolar transistors and CMOS transistors are integrated in a single chip. The BiCMOS IC has advantages of low power consumption and high integration density compatible with a CMOS IC and an advantage of high operational speed compatible with the bipolar IC.

In general, the upper limit of the operational voltage of the transistors is reduced with the advance of the finer process for the transistors. Especially, bipolar transistors have a low reverse bias withstand voltage for the P-N junction between the emitter and base of the bipolar transistors. The overvoltage exceeding the reverse bias withstand voltage breaks-down the base-to-emitter P-N junction, with the result that a breakdown current flows from emitter to base, and the forward current gain of the bipolar transistor is markedly reduced to retard the high operational speed of the bipolar transistor.

In view of the above, some proposals have been given for a tristate buffer incorporating a bipolar transistor wherein an applied emitter-to-base reverse bias voltage does not exceed the withstand voltage of the same.

FIG. 1 shows a circuit diagram of one of tristate buffers implemented by a BiCMOS configuration and proposed in a Patent Publication No. JP-A-2(1990)-214219. In the tristate buffer, input terminal VIN is connected to an internal circuit and output terminal VOUT is connected to a bus line. It is assumed that the tristate buffer of FIG. 1 is in a high-impedance state while the bus line is maintained at a high level by the output signal supplied from another tristate buffer.

In this state, non-inverting logic control terminal VNE is applied with a high-level signal, and inverting logic control terminal VNEB is applied with a low-level signal, with the result that nMOS transistor 15, nMOS transistor 4 and pMOS transistor 13 are in OFF-state. As a result, output terminal VOUT and the base of NPN transistor 6 are in a high-impedance state wherein these nodes are separated from the source line or ground line. The base of NPN transistor 6 is coupled to the output terminal VOUT by nMOS transistor 14, to prevent a reverse bias overvoltage from being applied between the emitter and base for avoiding the breakdown of the P-N junction.

FIG. 2 shows another example of tristate buffers which is proposed in JP-A-4(1992)-43713. It is assumed that the inverting logic control terminal VNEB is applied with a high-level signal, with the result that the tristate buffer is in a high-impedance state. Specifically, the high level at the inverting logic control terminal VNEB turns nMOS transistor 2, nMOS transistor 7 and pMOS transistors 1 and 25 off, with the result that the output terminal VOUT and the base of NPN transistor 6 are clamped together to stay in a high-impedance state. In this case, the breakdown of the P-N junction is also avoided due to the equal potential of the base of NPN transistor 6 with output terminal VOUT. The two conventional tristate buffers have a substantially equal concept wherein a switching transistor is provided between the base and emitter of NPN transistor 6 to couple the base and emitter during a high-impedance state of the tristate buffer.

In both the tristate buffers as described above, if an overvoltage exceeding the supply voltage is applied to the output terminal, the overvoltage generates current flow through the output terminal VOUT into the source line VCC.

Specifically, the overvoltage in the first example of FIG. 1 raises the base voltage through nMOS transistor 14 above collector voltage by, for example, 2.5 volts, which generates base-to-collector forward current along the P-N junction formed between the base and collector. The overvoltage in the second example of FIG. 2 also raises the base voltage through pMOS transistor 16 above collector voltage, which also generates base-to-collector forward current along the P-N junction formed between the base and collector. In addition, pMOS transistor 1 which has been off before the entry of the overvoltage may be turned on by the overvoltage if the overvoltage is as high as, for example, 4 volts. In this case, the overvoltage also generates a current flow from output terminal VOUT through pMOS transistors 16 and 1 to the source line VCC.

The current caused by the overvoltage at output terminal VOUT raises the supply voltage VDD of the IC to thereby retard the normal operation of the entire circuit. In addition, the influence of the overvoltage depends on the number of tristate buffers incorporated in the circuit and the number of tristate buffers which are in a high-impedance state, with the result that the influence is difficult to evaluate beforehand in a LSI design.

The tristate buffer thus allowing the current flow by the overvoltage suffers from a large power consumption in the another tristate buffer, which maintains the bus line at a high level, as well as a temperature rise in the transistors in the tristate buffer shown in the figures.

SUMMARY OF THE INVENTION

In view of the foregoing, it is an object of the present invention to provide a tristate buffer in an IC wherein a current flow caused by an overvoltage exceeding the supply voltage of the IC is substantially eliminated to thereby reduce the power consumption and to reduce temperature rise in the tristate buffers.

The present invention provides a tristate buffer comprising: an input block for receiving a set of input signals to generate high-level signal, low-level signal and high-impedance signal; an output block including a bipolar transistor having a base and a current path disposed between a first source line and an output terminal, and a first transistor in response to the low-level signal to couple the output terminal to a second source line; a base potential control block in response to the high-level signal to couple the base of the bipolar transistor to the first source line, in response to the low-level signal to couple the base of the bipolar transistor to the second source line, and in response to the high-impedance signal to couple the base of the bipolar transistor to the second source line during an initial stage of the high-impedance signal; and a current path block in response to the high-impedance signal to form a first current path between the output terminal and the second source line during the initial stage of the high-impedance signal and to break the first current path after the initial stage.

In accordance with tristate buffer of the present invention, reverse bias overvoltage between base and emitter of the bipolar transistor can be prevented during the high-impedance state of the tristate buffer except for the initial stage thereof, because the base and emitter are coupled only during the initial stage. In a preferred embodiment of the present invention, the reverse bias overvoltage during the initial stage of the high-impedance state can be also avoided by selecting the ON-resistance of each transistor in the first current path from the output terminal to the second source line to select an adequate potential on the base of the bipolar transistor.

The above and other objects, features and advantages of the present invention will be more apparent from the following description, referring to the accompanying drawings.

PREFERRED EMBODIMENTS OF THE INVENTION

Figure 1:
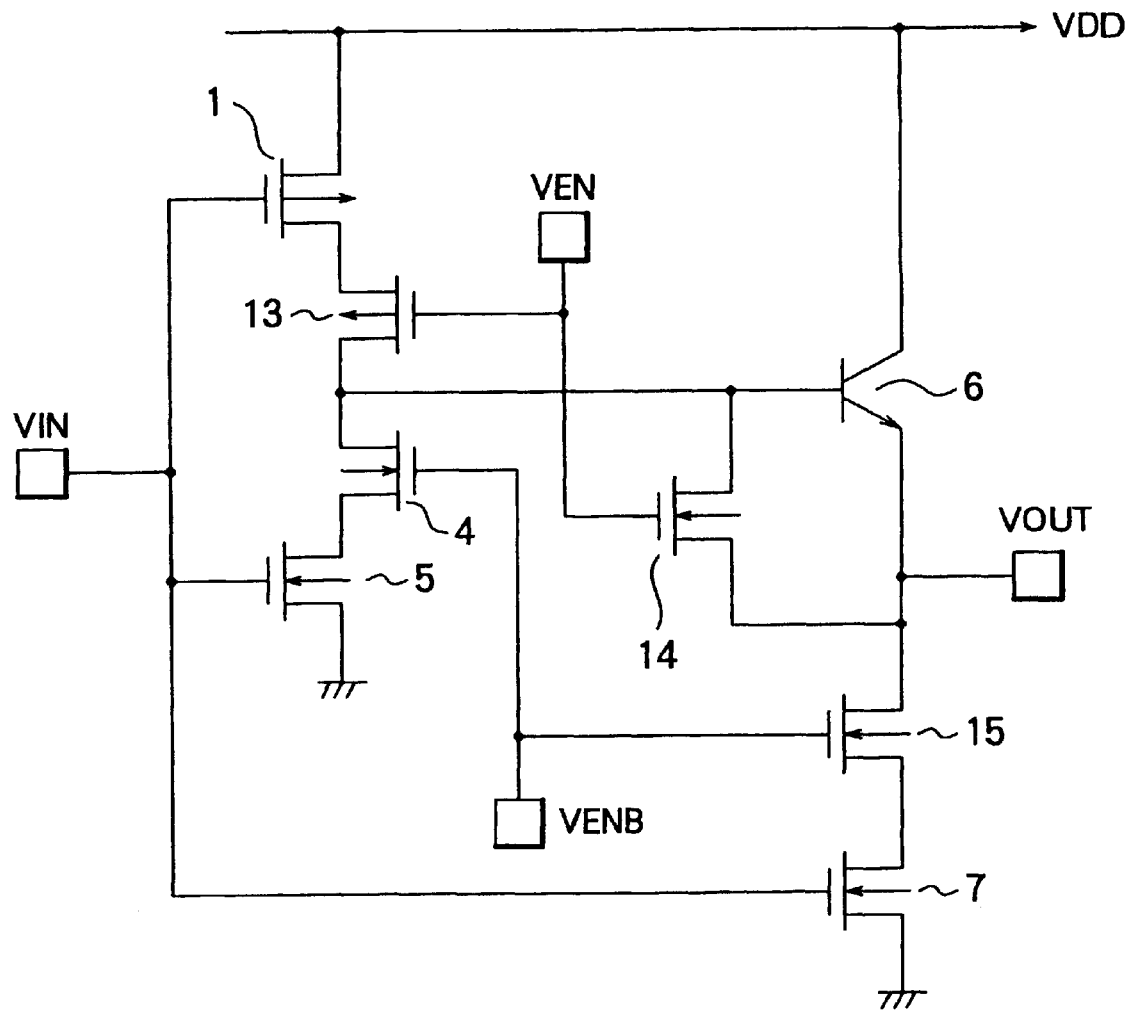
FIG. 1 is a circuit diagram of a first conventional BiCMOS tristate buffer.
Figure 2:
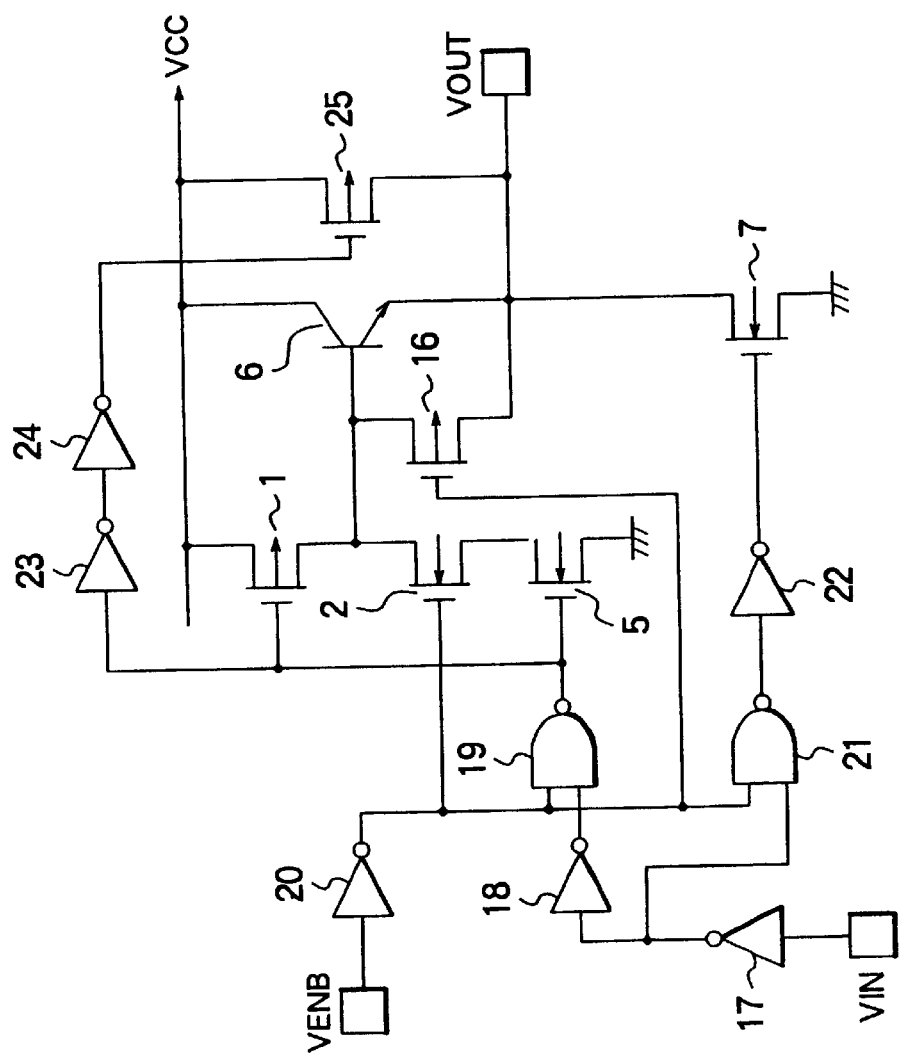
FIG. 2 is a circuit diagram of a second conventional BiCMOS tristate buffer.

Now, the present invention will be more specifically described based on preferred embodiments thereof with reference to the accompanying drawings wherein similar constituent elements are designated by the same or similar reference numerals or characters throughout the drawings.

Figure 3:
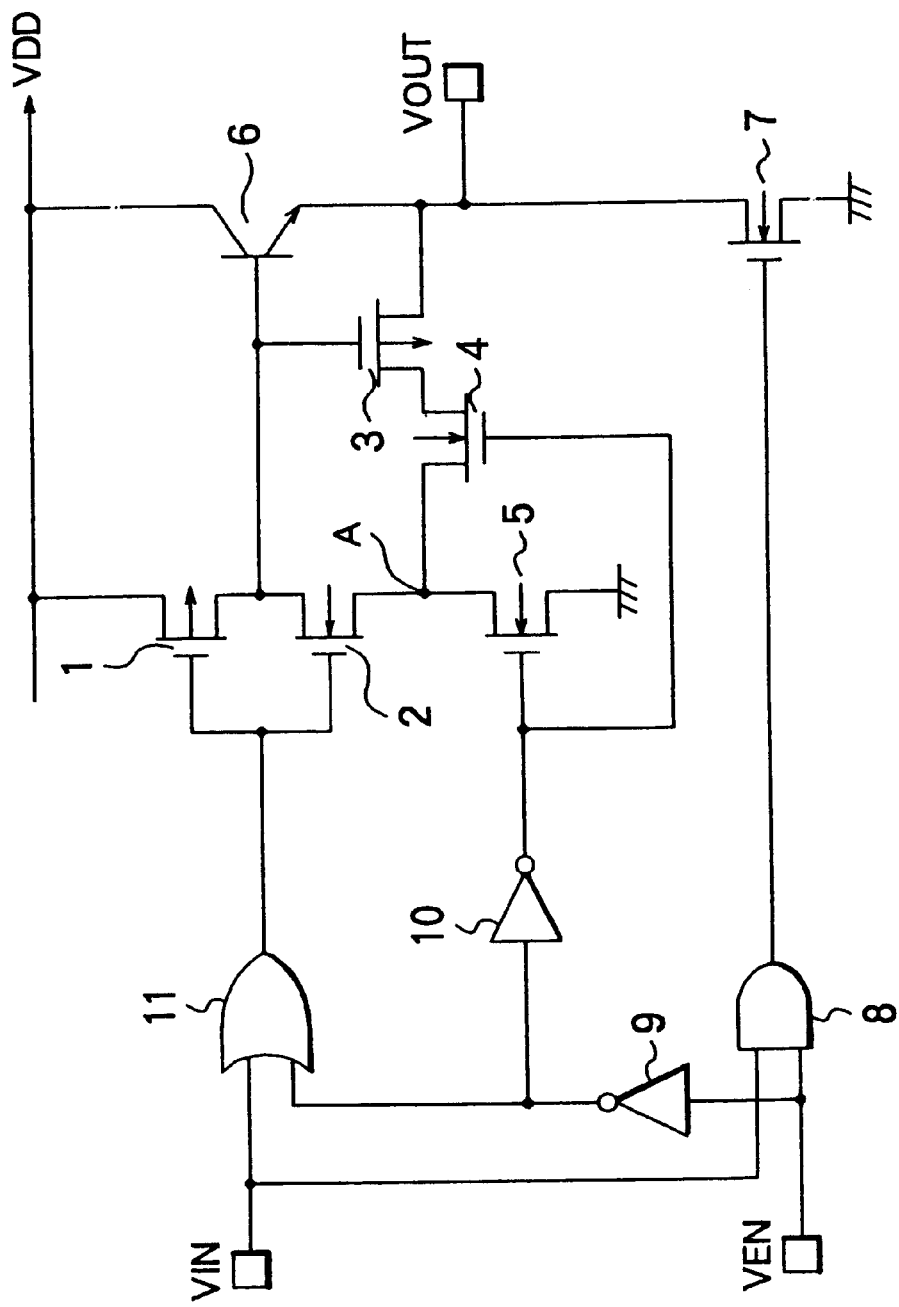
FIG. 3 is a circuit diagram of a BiCMOS tristate buffer according to a first embodiment of the present invention.

FIG. 3 shows a tristate buffer according to a first embodiment of the present invention. The tristate buffer comprises several functional blocks including an input gate block having a function for generating logic signals from an input signal and a control signal, an output gate block having a function for outputting a high-level signal, a low-level signal and a high-impedance state through the output of the tristate buffer, a charge supply block for charging the base of NPN transistor 6 in response to the high-level signal, a base voltage control block for discharging the base of NPN transistor 6 for controlling the base voltage in response to the low-level signal and the high-impedance signal, and a current path block for coupling the output terminal VOUT to the ground line during an initial stage of the high-impedance state in response to the high-impedance signal. The current path block also functions to control the base voltage in association with the base voltage control block.

The input gate block comprises an AND gate 8 having a first input connected to the input terminal VIN of the tristate buffer and a second input connected a control input VEN, an inverter 9 having an input connected to control input VEN, an inverter 10 having an input connected to the output of inverter 9, and an OR gate 11 having a first input connected to input terminal VIN and a second input connected to the output of inverter 9.

The charge supply block comprises a pMOS transistor 1 having a source connected to source line VDD and a gate connected to the output of OR gate 11. The base voltage control block comprises a nMOS transistor 2 having a drain connected to the drain of pMOS transistor 1, a gate connected to the output of OR gate 11, and a nMOS transistor 5 having a drain connected the source of nMOS transistor 2, a gate connected to the output of inverter 10 and a source connected to a ground line. The current path block comprises nMOS transistor 5 as mentioned above in the base voltage control block, nMOS transistor 4 having a source connected to the junction node "A" between nMOS transistors 2 and 5, a gate connected to the output of inverter 10, and a pMOS transistor 3 having a drain connected to the drain of nMOS transistor 4, a gate connected to the junction node between pMOS transistor 1 and nMOS transistor 2 and a source connected to the output terminal VOUT of the tristate buffer. The output gate block comprises NPN transistor 6 having a collector connected to source line VDD, a base connected to the junction node between pMOS transistor 1 and nMOS transistor 2 and an emitter connected to output terminal VOUT, and a nMOS transistor 7 having a drain connected to output terminal VOUT, a gate connected to the output of AND gate 8 and a source connected to the ground line. The charge supply block has a function for supplying charge to the base of NPN transistor 6, and the base voltage control block has a function for draining charge from the base of NPN transistor 6. The pMOS transistor 3 in the current path block detects an overvoltage at output terminal VOUT exceeding the supply voltage VDD during the initial stage of the high-impedance state to drain the overvoltage to the ground line through nMOS transistors 4 and 5. The nMOS transistors 4 and 5 break the current path from output terminal VOUT, i.e., from the emitter of NPN transistor 6, after the initial stage of the high-impedance state.

In the tristate buffer according to the present embodiment, output terminal VOUT is connected to a bus line (not shown in the drawing). It is assumed that the tristate buffer turns from a high-level state to a high-impedance state due to the input VEN changing from a high level to a low level and that the bus line is to be maintained at a higher potential by another tristate buffer. The higher potential is due to the fact that the nominal supply voltage of the another tristate buffer is higher than that of the tristate buffer shown in the figure or that the supply voltage deviates from the nominal supply voltage in both the tristate buffers.

First, in the assumed state, pMOS transistor 1 turns from ON-state to OFF-state, and nMOS transistor 2 turns from OFF-state to ON-state, with nMOS transistor 4, nMOS transistor 5 and nMOS transistor 7 remaining in ON-state, ON-state and OFF-state, respectively. Thereafter, nMOS transistors 4 and 5 turn from ON-state to OFF-state. The time delay for the change of state in nMOS transistors 4 and 5 is provided by inverter 10 having such a function.

Before nMOS transistors 4 and 5 turn from ON-state to OFF-state, NPN transistor 6, which was ON due to the high level of the base thereof, is quickly turned to OFF-state by nMOS transistors 2 and 5 in ON-state. At this instant, output terminal VOUT assumes a high-impedance state. In this state, i.e, during the initial stage of the high-impedance state, if output terminal VOUT rises up to above the supply voltage VDD by the another tristate buffer, pMOS transistor 3 turns from OFF-state to ON-state, thereby forming a current path between output terminal VOUT to the ground line through pMOS transistor 3 and nMOS transistors 4 and 5. The node "A" connecting nMOS transistors 2, 4 and 5 together assumes a potential VA expressed as follows:

$$VA = VO \times RN5 \div (RP3+RN4+RN5) = VO \times (Wn5)^{-1} \div \{(Wp3 \div 2)^{-1} + (Wn4)^{-1} + (Wn5)^{-1}\} \quad (1)$$

wherein VO, RP3, RN4 and RN5 are potential at output terminal VOUT, ON-resistance of pMOS transistor 3, ON-resistance of nMOS transistor 4 and ON-resistance of nMOS transistor 5, respectively. In equation (1), RP3, RN4 and RN5 are expressed by:

$$RP3 = |\beta \times (VGS-VTp)|^{-1} \quad (2)$$

$$RN4 = |\beta \times (VGS-VTn)|^{-1} \quad (3)$$

$$RN5 = |\beta \times (VGS-VTn)|^{-1} \quad (4)$$

$$\beta = \mu \times Cox \times (W \div L) \quad (5)$$

wherein VGS, VTp, VTn, $\mu$, Cox, W and L are gate-supply voltage of MOS transistor, threshold voltage of pMOS, threshold voltage nMOS transistors, mobility of pMOS transistor, gate-source capacitance per unit area, channel width and channel length of MOS transistor, respectively, with the mobility of nMOS transistor being assumed as twice as the mobility $\mu$ of pMOS transistor.

As understood from equations (1) to (5), the potential at node A can be selected as a desired value by selecting the size of transistors, i.e., channel width and channel length of pMOS, nMOS transistors 3, 4 and 5. The potential at node "A" is equal to the potential at the base of NPN transistor 6 because nMOS transistor 2 is ON. Accordingly, the base of NPN transistor 6 can be selected by selecting the size of transistors 3, 4 and 5: specifically, the ratio of size of transistors 3 and 4 to the size of transistor 5.

In a practical example of the first embodiment, the above values can be selected, for a specific case of VDD at 4.5 volts, base-to-emitter reverse bias withstand voltage of NPN transistor at 4 volts and potential of output terminal at 7 volts, such that the potential VA at node "A" is maintained between 3 volts and 4.5+VT volts assuming that VT is the threshold voltage of pMOS transistor 1. The minimum voltage (3 volts) at node "A" is determined by the difference between the potential VA=7 volts at output terminal VOUT and the reverse bias withstand voltage (4 volts) of NPN transistor 6 because the potential below the difference generates a reverse bias voltage exceeding the reverse bias withstand voltage of the base-to-emitter P-N junction. The maximum voltage (4.5+VT volts) at node "A" is determined by the consideration that the potential at node A above 4.5+VT volts turns pMOS transistor 1 from OFF-state to ON-state to thereby form a current path from output terminal VOUT through node "A" to source line VDD.

After the series of operation, i.e., after the initial stage of the high-impedance state, nMOS transistors 4 and 5 turn off, as mentioned previously, to thereby break the current path from output terminal VOUT to the ground line. This means that output terminal VOUT assumes a high-impedance state and yet does not have a current path to source line VDD or the ground line by an overvoltage, with the consequence that P-N junction in NPN transistor 6 is free from breakdown.

In the practical example as mentioned above, the transistor sizes can be determined as follows. First, from equation (1) for the potential VA at node "A", gate widths of pMOS transistor 3, nMOS transistors 4 and 5 which satisfy the potential range between 3 volts and 4.5+VT volts for the potential VA are to be obtained. It is assumed that the threshold voltage VT of pMOS transistor 3 is 0.7 volts and the gate width of nMOS transistor 5 is 40 $\mu$m. The gate width of nMOS transistor 5 may be at any value, however, so long as nMOS transistor 5 has a sufficient function for draining charge stored on the parasitic capacitance associated with the base of NPN transistor 6. In addition it is assumed that the gate lengths of pMOS transistor 3, nMOS transistors 4 and 5 are 1 $\mu$m.

From equation (1) and the assumption as mentioned above, the gate widths of pMOS transistor 3 and nMOS transistor 4 can be determined at values between 120 $\mu$m and 464 $\mu$m and between 90 $\mu$m and 232 $\mu$m, respectively, to maintain the potential VA at node "A" between 3 volts and 5.2 (4.5+0.7) volts. These values for the gate widths of pMOS transistor 3 and nMOS transistor 4 are obtained from the assumption that the ON-resistances of these transistors 3 and 4 have the same value. When the gate widths of the transistors 3 and 4 reside within the range as recited above, the potential VA at node "A" stays between 3 volts and 5.2 volts, which potential is transferred to the base of NPN transistor 6 via nMOS transistor 2 which is ON during the high-impedance state of the tristate buffer.

In the case as described above, the emitter-to-base voltage remains in a range between 1.8 volts and 4 volts which is obtained by subtracting the range between 3 volts and 5.2 volts as mentioned above from the potential, 7 volts, at output terminal VOUT. The range 1.8 volts and 4 volts for the emitter-to-base voltage does not cause any breakdown at the P-N junction of NPN transistor 6 and breakdown of pMOS transistor 1.

The above discussion is mainly directed to the base-to-emitter reverse bias voltage for P-N junction of a bipolar transistor in consideration that the current fine process technology for LSI reduces the upper limit of the supply voltage applicable to transistor elements. When a BiCMOS technology is employed, withstand voltage for MOS transistors is also important. Specifically, if an overvoltage exceeding the withstand voltage of a MOS transistor is applied, the gate oxide film thereof is damaged to destroy the function of the MOS transistor itself.

Referring back to FIG. 1, it is assumed that the withstand voltage between the gate and source or drain of MOS transistors is 5 volts, and the maximum absolute voltage for a nominal supply voltage of 5 volts, i.e., 7 volts, is applied to output terminal VOUT. In this case, nMOS transistor 14 turns on to supply 7 volts to the drain of nMOS transistor 4. When gate voltage of the nMOS transistor 4 is 0 volt, 7 volts applied between the gate and drain destroys the nMOS transistor 4 which has only a withstand voltage 5 volts.

The destruction of MOS transistor may take place in the embodiment of FIG. 3, if 7 volts is applied through output terminal VOUT. In this case, pMOS transistor 3 turns on to apply 7 volts to the drain of nMOS transistor 4. When the gate voltage for nMOS transistor 4 is 0 volt, 7 volts applied between the gate and drain of nMOS transistor 4 destroy the gate oxide film of nMOS transistor 4 which has only a withstand voltage of 5 volts.

Figure 4:
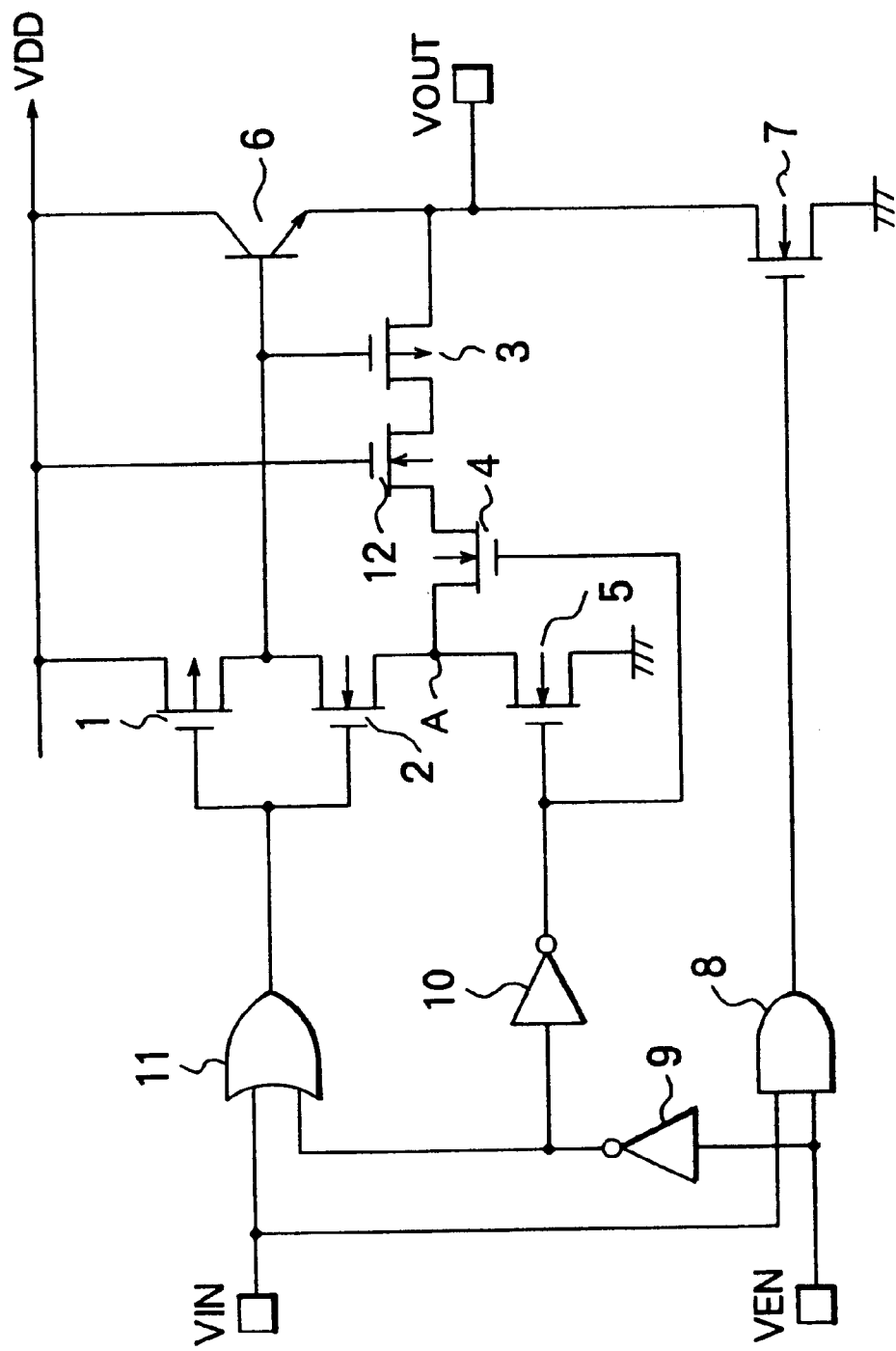
FIG. 4 is a circuit diagram of a BiCMOS tristate buffer according to a second embodiment of the present invention.

FIG. 4 shows a tristate buffer according to a second embodiment of the present invention, wherein MOS transistor 4 is protected against a dielectric breakdown. The tristate buffer of the present embodiment is similar to the first embodiment except for a nMOS transistor 12 interposed between the drain of pMOS transistors 3 and drain of nMOS transistor 4 and having a gate connected to source line VDD. The nMOS transistor 12 forms a part of current path from output terminal VOUT to the ground line. The nMOS transistor 12 has a function for preventing an overvoltage exceeding the withstand voltage of nMOS transistor 4 from being applied between the gate and drain of nMOS transistor 4.

Similarly to the first embodiment, before nMOS transistors 4 and 5 turn from ON-state to OFF-state during the initial stage of a high-impedance state, nMOS transistor 2 is in ON-state, with the result that NPN transistor 6, which is in ON-state due to the high level of the base thereof, turns off quickly to allow output terminal VOUT to turn into a high-impedance state due to nMOS transistors 2 and 5 discharging the base of NPN transistor 6. If the potential at output terminal VOUT rises above the supply voltage VDD in this state due to an overvoltage supplied from another tristate buffer, pMOS transistor 3 turns from OFF-state to ON-state to form a current path from output terminal VOUT through pMOS transistor 3, nMOS transistor 12, nMOS transistor 4 and nMOS transistor 5 to the ground line. The turn-on of nMOS transistor 3 applies the drain of nMOS transistor 12 with a potential equal to the potential at output terminal VOUT. However, the gate of nMOS transistor 12 maintained at the source potential VDD supplies the source of nMOS transistor 12 with a potential which is equal to VDD-VT wherein VT is the threshold voltage of nMOS transistor 12. The potential VA at node "A" and ON-resistance RN12 of nMOS transistor 12 are expressed by:

$$VA = VO \times RN5 \div (RP3 + RN12 + RN4 + RN5) \quad (6)$$
$$= VO \times (Wn5)^{-1} \div \{(Wp3 \div 2)^{-1} + (Wn12)^{-1} + (Wn4)^{-1} + (Wn5)^{-1}\}$$

$$RN12 = \{\beta \times (VGS - VTn)\}^{-1} \quad (7)$$

wherein symbols similar to those in equations (1) to (5) are used.

As understood from equation (6), the potential VA at node "A" can be selected by selecting the sizes of transistors, i.e., the channel widths and channel lengths of pMOS transistor 3, nMOS transistors 12, 4 and 5. The potential of the base of NPN transistor 6 is equal to the potential at node "A" because nMOS transistor 2 is ON.

In a practical example for the tristate buffer of FIG. 4, wherein supply voltage VDD, reverse bias withstand voltage of P-N junction of NPN transistor 6, gate-to-source or -drain withstand voltage, threshold voltage of nMOS transistor 12 and the potential VO at output terminal VOUT are 4.5 volts, 4 volts, 5 volts, 0.7 volts and 7 volts, respectively, the potential VA at node "A" should be determined at a range between 3 volts and 4.5+VT volts, similarly to the first embodiment, wherein VT is the threshold voltage of pMOS transistor 1.

After nMOS transistors 4 and 5 turn off to break the current path from output terminal VOUT to the ground line, output terminal VOUT assumes a high-impedance state, without forming any current path. In this state, if an overvoltage is applied to output terminal, the overvoltage applies 7 volts at the drain of nMOS transistor 12, which applies only 3.8 volts as the gate-to-drain voltage of nMOS transistor 4 which has a withstand voltage of 5 volts. This is because, although the potential at the drain of nMOS transistor 12 is 7 volts, the source potential of nMOS transistor 12 falls down to 3.8 volts, which is obtained by subtraction of threshold voltage (0.7 volts) from the gate voltage (4.5 volts) of nMOS transistor 12. Accordingly, nMOS transistor 4 is free from dielectric breakdown of the gate oxide film.

In the practical example of FIG. 4, the transistor sizes can be determined as follows. First, from equation (6) for the potential VA at node "A", gate widths of pMOS transistor 3, nMOS transistors 4, 5 and 12 which satisfy the range between 3 volts and 4.5+VT volts for the potential VA are to be obtained. It is assumed that the threshold voltage VT of pMOS transistor 3 is 0.7 volts and the gate width of nMOS transistor 5 is 40 µm. The gate of nMOS transistor 5 may be of any width, however, so long as nMOS transistor 5 has a sufficient function for draining charge stored on the parasitic capacitance associated with the base of NPN transistor 6. In addition, it is assumed that the gate lengths of pMOS transistor 3, nMOS transistors 4 and 5 are 1 µm.

From equation (6) and the assumption as mentioned above, the gate widths of pMOS transistor 3, nMOS transistor 4 and nMOS transistor 12 can be determined at values between 180 µm and 696 µm, between 90 µm and 348 µm, and between 90 µm and 348 µm, respectively, to maintain the potential VA at node "A" between 3 volts and 5.2 (4.5+0.7) volts. These values for the gate widths of pMOS transistor 3 and nMOS transistors 4 and 12 are obtained from the assumption that the ON-resistances of these transistors 3, 4 and 12 have the same value.

As described above, when the gate widths of the transistors 3, 4 and 12 reside within the range as recited above, the potential VA at node "A" stays between 3 volts and 5.2 volts during the application of 7 volts at output terminal VOUT, which potential is transferred to the base of NPN transistor 6 via nMOS transistor 2 to maintain the emitter-to-base reverse bias voltage within the withstand voltage.

Specifically, the emitter-to-base voltage remains in a range between 1.8 volts and 4 volts, which are obtained by subtracting the range between 3 volts and 5.2 volts as mentioned above from the potential, 7 volts, at output terminal VOUT. The range 1.8 volts and 4 volts for the emitter-to-base voltage does not cause any breakdown at the P-N junction of NPN transistor 6 in view of the designed reverse bias withstand voltage of the P-N junction, i.e., 4 volts.

In the embodiments as described above, only the elements are shown which are considered necessary to describe the function of the tristate buffer. In a practical circuit arrangement, however, other elements may be included therein or modification may be made therefrom in order for assisting the function of the tristate buffer. For example, a nMOS transistor having a gate connected to the source line may be interposed between output terminal VOUT and nMOS transistor 7 to protect nMOS transistor 7 against drain-to-gate breakdown. In addition, a resistor may be inserted between source line VDD and the collector of NPN transistor 6 to limit excess collector current.

Although the present invention is described with reference to preferred embodiments thereof, the present invention is not limited thereto and various modifications or alterations can be easily made therefrom by those skilled in the art without departing from the scope of the present invention.

What is claimed is:

1. A tristate buffer comprising: an input block for receiving a set of input signals to generate high-level signal, low-level signal and high-impedance signal;

an output block including a bipolar transistor having a base and a current path disposed between a first source line and an output terminal, and a first transistor in response to said low-level signal to couple the output terminal to a second source line;

a base potential control block in response to said high-level signal to couple the base of said bipolar transistor to the first source line, in response to the low-level signal to couple the base of said bipolar transistor to the second source line, and a current path block in response to said high-impedance signal to form a first current path between the output terminal and the second source line during an initial stage of said high-impedance signal and to break said first current path after the initial stage;

wherein said base potential control block provides divided voltage by said current path block to the base of said bipolar transistor during the initial stage of said high impedance signal, and cuts off the base of said bipolar transistor from the output terminal and the second source line after the initial stage of said high-impedance signal in response to said high impedance signal.

2. A tristate buffer as defined in claim 1 wherein the base of said bipolar transistor is coupled to a first node in said first current path during at least the initial stage of said high-impedance signal.

3. A tristate buffer comprising: an input block for receiving a set of input signals to generate high-level signal, low-level signal and high-impedance signal; an output block including a bipolar transistor having a base and a current path disposed between a first source line and an output terminal, and a first transistor in response to said low-level signal to couple the output terminal to a second source line; a base potential control block in response to said high-level signal to couple the base of said bipolar transistor to the first source line, in response to the low-level signal to couple the base of said bipolar transistor to the second source line, and in response to said high-impedance signal to couple the base of said bipolar transistor to the second source line during an initial stage of said high-impedance signal; and a current path block in response to said high-impedance signal to form a first current path between the output terminal and the second source line during the initial stage of said high-impedance signal and to break said first current path after the initial stage, wherein said first current path includes a pMOS transistor having a gate connected to the base of said bipolar transistor and a source connected to the output terminal, a first nMOS transistor having a source-drain current path between the drain of said pMOS transistor and said first node, and a second nMOS transistor having a source-drain current path connected between said first node and the second source line.

4. A tristate buffer as defined in claim 3 wherein said first current path further includes a third nMOS transistor having a source-drain current path connected in series with the source-drain current path of said second nMOS transistor between the drain of said pMOS transistor and said first node.

* * * * *